(12) United States Patent
Vienot et al.

(10) Patent No.: US 11,254,514 B2
(45) Date of Patent: Feb. 22, 2022

(54) FEEDING ASSEMBLY, COMPONENT HANDLING ASSEMBLY AND METHOD OF FEEDING COMPONENTS

(71) Applicant: ISMECA SEMICONDUCTOR HOLDING SA, La Chaux-de-Fonds (CH)

(72) Inventors: Sylvain Vienot, Villers-le-Lac (FR); Valerio Osler, Boudry (CH); Philippe Roy, Gilley (FR)

(73) Assignee: ISMECA SEMICONDUCTOR HOLDING SA, La Chaux-de-Fonds (CH)

( * ) Notice: Subject to any disclaimer, the term of this patent is extended or adjusted under 35 U.S.C. 154(b) by 0 days.

(21) Appl. No.: 17/043,534

(22) PCT Filed: May 14, 2019

(86) PCT No.: PCT/IB2019/053992
§ 371 (c)(1),
(2) Date: Sep. 29, 2020

(87) PCT Pub. No.: WO2020/003019
PCT Pub. Date: Jan. 2, 2020

(65) Prior Publication Data
US 2021/0147156 A1    May 20, 2021

(30) Foreign Application Priority Data
Jun. 29, 2018    (CH) .................................... 00821/18

(51) Int. Cl.
*B65G 47/14*    (2006.01)
*H05K 13/02*    (2006.01)
(Continued)

(52) U.S. Cl.
CPC ....... *B65G 47/1421* (2013.01); *H05K 13/028* (2013.01); *B65G 47/256* (2013.01); *B65G 2203/042* (2013.01); *H05K 13/043* (2013.01)

(58) Field of Classification Search
CPC ................ B65G 47/14; B65G 47/1421; B65G 47/1471; B65G 47/256; B65G 47/295;
(Continued)

(56) References Cited

U.S. PATENT DOCUMENTS 6,345,728 B1 *   2/2002   Kawaguchi .......... H05K 13/043
                                                        221/239
8,985,305 B2 *   3/2015   Wong ................. B65G 47/1421
                                                        198/383

(Continued)

FOREIGN PATENT DOCUMENTS

CN        102009824 A      4/2011
JP       2000-302230 A    10/2000
(Continued)

OTHER PUBLICATIONS

International Search Report issued in International Application No. PCT/IB2019/053992 dated Oct. 4, 2019.

*Primary Examiner* — William R Harp
(74) *Attorney, Agent, or Firm* — Foley & Lardner LLP

(57) ABSTRACT

A feeding assembly and a method of feeding components comprising a track along which components can be moved, said track comprising a sloped surface and a ledge, wherein said sloped surface slopes in a direction perpendicular to the direction which the components move along the track so that the components maintain a tilted orientation as they move along the track, a pickup platform comprising a pocket which can receive components from said track, and a pivot on which the pickup platform can be selectively rotated between a first position and second position. In the first position, the pocket is aligned with the track and the pocket
(Continued)

is parallel with the sloped surface of the track, so that a component can move from the track into the pocket of the pickup platform. In the second position the pocket is in a horizontal orientation.

20 Claims, 7 Drawing Sheets

(51) Int. Cl.
*B65G 47/256* (2006.01)
*H05K 13/04* (2006.01)

(58) Field of Classification Search
CPC ...... B65G 27/00; B65G 27/04; H05K 13/028; H05K 13/043
See application file for complete search history.

(56) References Cited

U.S. PATENT DOCUMENTS

| 9,561,914 B1* | 2/2017 | Yip ........................ B65G 27/02 |
| 2015/0204943 A1 | 7/2015 | Yip et al. |

FOREIGN PATENT DOCUMENTS

| JP | 2001-348117 A | 12/2001 |
| WO | WO-2011/150925 A1 | 12/2011 |
| WO | WO-2012/073283 A1 | 6/2012 |

* cited by examiner

FEEDING ASSEMBLY, COMPONENT HANDLING ASSEMBLY AND METHOD OF FEEDING COMPONENTS

CROSS REFERENCE TO RELATED APPLICATIONS

This application is a national stage entry of International Application No. PCT/IB2019/053992, filed May 14, 2019, which claims priority from Swiss Application No. 00821/18, filed Jun. 29, 2018, the contents of which are incorporated by reference herein in their entirety.

FIELD OF THE INVENTION

The present invention relates to a feeding assembly comprising, a track which has a sloped surface which maintains components in a tilted orientation as they are moved along the track, and a pickup platform which has a pocket, wherein the pickup platform is movable between a first position where the pocket can receive components from the track and a second position where the pocket is horizontal to facilitate secure picking of the component from the pocket. There is further provided a component handling assembly which uses the feeding assembly, and a corresponding method of feeding components using said feeding assembly.

DESCRIPTION OF RELATED ART

In existing feeding assemblies components often overlay one another (piggy-back), or partially overlay one another, as they move along the track of the feeding assembly. When components overlay one another, or partially overlay one, this makes it difficult to pick components from the feeding assembly. Typically components are delivered from the track of the feeding assembly to a pickup station where they are then picked from the pickup station by a pickup head; however in order to ensure securing picking of components the components should be delivered consecutively to the pickup station; to ensure that the components are delivered consecutively to the pickup station the components must be moved in single-file along the track of the feeding assembly. If components overlay one another, or partially overlay one another on the track of the feeding assembly, this can result in a stack of two or more components being delivered from the feeding assembly to the pickup station or cracking the components while picking them; when the pickup head then tries to pick this stack of components it is inevitable that one or more of the components in the stack will fall from the pickup head, or that the pickup head will be unable to pick the stack at all.

Adequate solutions to ensure that components move in a single-file along the track of a feeding assembly do not exist in the field; and in particular solutions which ensure that components move in a single-file along the track of a feeding assembly, which do not comprise secure picking of the components, do not exist in the field.

It is an aim of the present invention to obviate, or mitigate, at least some of the above mentioned problems.

BRIEF SUMMARY OF THE INVENTION

According to the present invention there is provided a feeding assembly comprising, a track along which components can be moved, said track comprising a sloped surface and a ledge, wherein said sloped surface slopes in a direction which is perpendicular to the direction which the components move along the track so that the components are maintained in a tilted orientation as they move along the track; a pickup platform which comprises a pocket which can receive components from said track; wherein the feeding assembly further comprise a pivot on which the pickup platform can be selectively rotated between a first position and second position, wherein in its first position the pocket is aligned with the track and the pocket is parallel with the sloped surface of the track, so that a component can move from the track into the pocket of the pickup platform, and in its second position the pocket is in a horizontal orientation.

Advantageously, a track having a sloped surface and ledge ensures that components are maintained in a tilted orientation as they move along the track; because of the tilted orientation a component which overlays, or partially overlays, another component on the track will more easily fall from the track, thus ensuring that components will move in single-file along the track. However securing picking of components from the feeding assembly could not be achieved if the components are picked in the tilted orientation; moving a component into the pocket of the pickup platform and then rotating the pickup platform to move the pocket into a horizontal orientation brings the component into an orientation which is optimum for secure picking of the component. Thus the present invention advantageously provides for more reliable single-file movement of the components along the track, without compromising secure picking and provides a reduced risk of the components being damaged during picking.

In a preferred embodiment said track along which components can be moved is a linear track.

Preferably a surface of the ledge is perpendicular to the sloped surface. Thus the ledge and sloped surface form a surface having an L-shaped cross section.

Preferably the pocket of the pickup platform comprises, a first surface and second surface; wherein the first and second surfaces are arranged such that when the pickup platform is in its first position the first surface is aligned with the sloped surface of the track, and the second surface is aligned with a surface of the ledge, and when the pickup platform is in its second position the first surface is in a horizontal orientation.

The first surface and second surface may be perpendicular to one another or substantially perpendicular to one another.

Preferably the pocket of the pickup platform further comprises a wall which blocks movement of a component in a direction parallel to the direction in which the components move along the track.

Most preferably said pivot on which the pickup platform can be selectively rotated provides an axis of rotation which is parallel to the direction in which the components are moved along the track.

The thickness of the ledge is preferably equal to, or less than, the thickness of a component so that only one single component can occupy any respective position along the track. It should be noted that the thickness of the ledge is the distance from the sloped surface to the edge of the ledge. Most preferably the thickness of the ledge is equal to, or less than, the thickness of a side of a component. Preferably the component is cube-shaped or cuboid-shaped, having an upper surface, and lower surface which is opposite to the upper surface, and four side surfaces. The thickness of the component is the height of the component when its lower surface is resting on a horizontal surface; i.e. the height to which any of said four sides surface extend to above the horizontal surface, when the lower surface is resting on a horizontal surface.

Preferably the thickness of the ledge is between 20-100 µm. More preferably the thickness of the ledge is between 30-70 µm. Most preferably the thickness of the ledge is 50 µm.

Components on the track will be rest, on their side, on the ledge of the track, and will lean against the sloped surface of the track, so as to achieve a tilted orientation; the components will be moved along the track in this tilted orientation. Because the thickness of the ledge is equal to, or less than, the thickness of said side of the component, at any position along the length of the track the ledge is thick enough to support only one single component; two or more components cannot occupy the same position along track. If two components are moved to overlay each other (i.e. if one component 'piggy-backs' on another), or partially overlay each other, on the track, then the side of only one of the components (i.e. the side of the component closest to the sloped surface of the track) will be supported on the ledge, and the other component (i.e. the component which is overlaying, or partially overlaying, the component closest to the sloped surface) will fall from the ledge since it is not supported by the ledge.

In an embodiment a first outlet is provided in the pocket of the pickup platform, and wherein said first outlet is fluidly connected to a vacuum generating means which can be selectively operated to generate a vacuum, and wherein said first outlet is positioned such that a component which has been passed from the track into the pocket will overlay said first outlet. Advantageously, a vacuum provided at said first outlet by the vacuum generating means, will hold the component in the pocket as the pickup platform is rotated between its first and second positions. Most preferably the vacuum generating means is configured to generate a vacuum so as to provide a vacuum at said first outlet, only when a component is present in the pocket. Most preferably the vacuum generating means is configured to stop providing a vacuum at said first outlet when pocket is in its second position. This allows a pickup head (such as a pickup head on a turret), which is designed to hold a component using vacuum, to more easily pick the component from the pocket. In another embodiment, the vacuum generating means is configured to stop providing a vacuum at said first outlet when the component is being picked from the pocket (for example, when the component is being picked from the pocket by a pickup head).

In an embodiment a second outlet is further provided at an end of the track which is adjacent to the pickup platform, and wherein said second outlet is fluidly connected to a vacuum generating means which can be selectively operated to generate a vacuum, and wherein said second outlet is positioned such that a component which has reached the said end of the track will overlay said second outlet. Advantageously, a vacuum provided at said second outlet by the vacuum generating means, will hold the component on the track as the pickup platform is rotated between its first and second positions. Most preferably the vacuum generating means is configured to generate a vacuum so as to provide a vacuum at said second outlet, only when a component occupies the end of the track which is adjacent to the pickup platform.

In an embodiment the feeder assembly further comprises a sensor which is arranged to sense when the number of components queued-up from the end adjacent the pickup platform has reached a predefined maximum; and a blower which is configured to blow additional components which arrive at said queue off the track when the sensor has detected that the number of components queued-up from the end adjacent the pickup platform has reached a predefined maximum.

In an embodiment the feeder assembly further comprises a slanted surface, a feedback track, and a delivery device, wherein said slanted surface is arranged to receive components which have fallen from the track or have been blown from the track by a blower, and to direct said components to said feedback track; and wherein said feedback track is configured to transport said components it receives from the slanted surface to the delivery device; and wherein the delivery device is configured to deliver said components back on to the track. Most preferably the delivery device is configured to deliver said components back on to the track by delivering said component onto an end of the track which is opposite to the end of the track which is adjacent the pickup platform.

In an embodiment the feeder assembly further comprises a first vibration means which is operably connected to the track so that it can selectively operated to vibrate the track, wherein vibration of the track causes the components to move along the track towards the pickup platform. Most preferably vibration of the track by the first vibration means causes a component, which is at the end of the track adjacent to the pickup platform, to move from the track into the pocket of the pickup platform.

In an embodiment the feeder assembly further comprises a second vibration means which is operably connected to the feedback track so that it can selectively operated to vibrate the feedback track, wherein vibration of the feedback track causes the components which are on the feedback track to move along the feedback track towards the delivery device. Most preferably vibration of the feedback track by the second vibration means causes the components which are on the feedback track to move along the feedback track towards the delivery device and to subsequently move from the feedback track into the delivery device.

In yet another embodiment the assembly comprises a single vibration means only; the single vibration means is connected to both the track and the feedback track and is operable to vibrate both these tracks.

According to a further aspect of the present invention there is provided a component handling assembly comprising, a feeder assembly according to any of the preceding claims; a pickup head, wherein said pick up head is arranged such that it aligned over the pocket of the pickup platform when the pickup platform is in its second position.

In a preferred embodiment in which the pocket of the pickup platform comprises, a first surface and second surface, wherein the first and second surfaces are arranged such that when the pickup platform is in its first position the first surface is aligned with the sloped surface of the track, and the second surface is aligned with a surface of the ledge, and when the pickup platform is in its second position the first surface is in a horizontal orientation, the pickup head is configured so that so that it can be selectively arranged to overlay the first surface of the pocket when the pickup platform is in its second position.

The pickup head may be a pickup head provided on a rotatable turret which comprises a plurality of pickup heads, and wherein the turret is arranged so that it can be rotated so that each pickup head is consecutively aligned over the pocket of the pickup platform when the pickup platform is in its second position.

According to a further aspect of the present invention there is provided method of feeding components using the feeder assembly of any of the preceding claims, comprising the steps of, moving components along the track of the feeder assembly; moving a component from the track into the pocket of the pickup platform; after the component has been moved into the pocket of the pickup platform, rotating the pickup platform around the pivot to its second position.

The method may further comprise the steps of, picking said component from the pocket of the pickup platform while the pickup platform is in its second position. The step of picking said component from the pocket of the pickup platform may comprise using a pickup head to pick said component from the pocket. The step of using a pickup head to pick said component from the pocket may comprise moving said pickup head towards the pocket, holding the component on the pickup head by means of a vacuum, and moving the pickup head away from the pocket as the component is held on the pickup head by means of a vacuum.

The method may further comprise the steps of, rotating the pickup platform around the pivot to its first position, moving a second component from the track into the pocket of the pickup platform; after the component has been moved into the pocket of the pickup platform, rotating the pickup platform around the pivot to its second position.

The method may further comprise the steps of, picking said second component from the pocket of the pickup platform while the pickup platform is in its second position. The step of picking said second component from the pocket of the pickup platform may comprise using a pickup head to pick said component from the pocket.

The step of moving components along the track of the feeder may comprise vibrating the track to cause the components to hop along said track in the direction of the pickup platform.

The method may further comprise applying a vacuum to a component which is located in the pocket, wherein the vacuum holds the component in the pocket as the pickup platform is rotated between its first and second positions.

The method may further comprise the step of turning off the vacuum provided to the component which is located in the pocket when the pickup platform is in its second position. This allows the component to be more easily picked from the pocket.

The method may further comprise applying a vacuum to a component which is located at the end of the track adjacent to the pickup platform, wherein the vacuum holds the component on the track as the pickup platform is rotated between its first and second positions.

The method may further comprise the steps of, detecting when the number of components queued-up along the track, from a end of the track adjacent the pickup platform, has reached a predefined maximum; and in response to detected that the number of components queued-up along the track, from a end of the track adjacent the pickup platform, has reached a predefined maximum, activating a blower to blow additional components which arrive at said queue off the track.

The method may further comprise the steps of, receiving on to a slanted surface, components which have fallen from the track or have been blown from the track by a blower, and sliding, under the influence of gravity, said received components along said slanted surface and onto a feedback track; moving said components along said feedback track to a delivery device; using the delivery device to deliver said components onto the track.

Most preferably the step of using the delivery device to deliver said components onto the track, comprise using said delivery device to deliver said components onto an end of the track which is opposite to the end of the track which is adjacent the pickup platform. Most preferably the step of moving said components along said feedback track to a delivery device comprises vibrating the feedback track to cause the components to hop along said track in the direction of the delivery device.

Most preferably the pickup head will be a pickup head provided on a rotatable turret; in such a case the method may comprise the steps of, a) moving components along the track of the feeder assembly;
b) moving a component from the track into the pocket of the pickup platform;
c) after the component has been moved into the pocket of the pickup platform,
d) rotating the pickup platform around the pivot to its second position;
e) picking said component from the pocket of the pickup platform using a pickup head on the turret;
f) rotating the pickup platform around the pivot to its first position,
g) moving another component from the track into the pocket of the pickup platform;
h) after said other component has been moved into the pocket of the pickup platform, rotating the pickup platform around the pivot to its second position
i) rotating the turret so that another pickup head is aligned over the pocket of the pickup platform;
j) picking said other component from the pocket using said other pickup head on the turret.

In one embodiment the steps f-j are repeated a plurality of times so that a plurality of components are consecutively moved into the pocket of the pickup platform and are picked consecutively using respective pickup heads on the turret.

BRIEF DESCRIPTION OF THE DRAWINGS

The invention will be better understood with the aid of the description of an embodiment given by way of example and illustrated by the figures, in which:

FIGS. 6 and 7 also a component handling assembly according to a further aspect of the present invention.

DETAILED DESCRIPTION OF POSSIBLE EMBODIMENTS OF THE INVENTION

Figure 1:
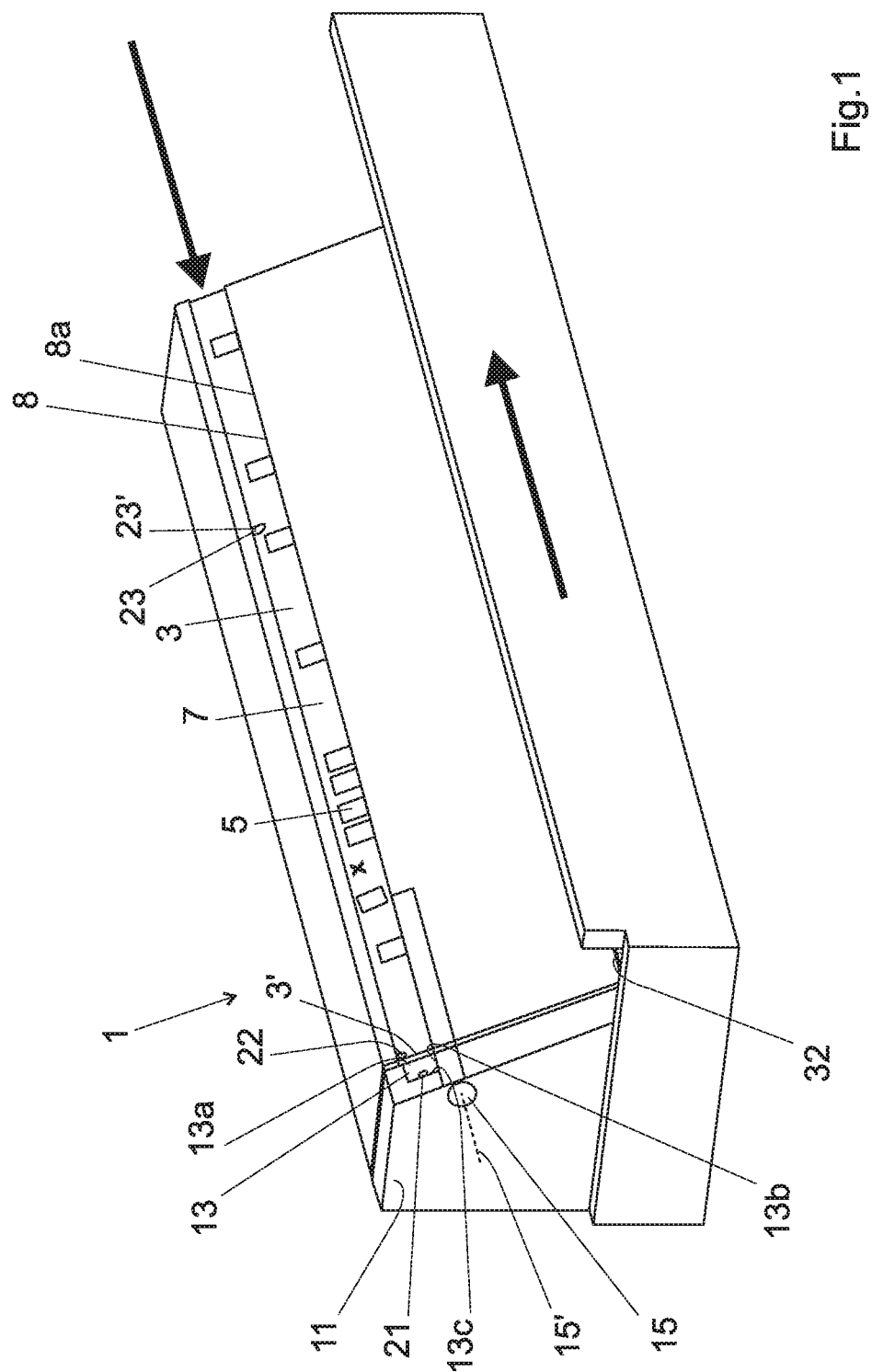
FIGS. 1-7 show a perspective view of a feeding assembly according to one embodiment of the present invention, when in use.

FIGS. 1-7 show a perspective view of a feeding assembly 1 according to an embodiment of the present invention, when in use.

The feeding assembly 1 comprises a track 3 along which components 5 can be moved, said track 3 comprising a sloped surface 7 and a ledge 8, wherein said sloped surface 7 slopes in a direction which is perpendicular to the direction (arrow x) which the components 5 move along the track 3 so that the components 5 are maintained in a tilted orientation as they move along the track 3. In this example a surface 8a of the ledge 8 is perpendicular to the sloped surface 7. Thus the ledge 8 and sloped surface 7 form a surface having an L-shaped cross section. Also, in the feeding assembly 1 example the track 3 is a linear track.

The feeding assembly 1 comprises a pickup platform 11 which comprises a pocket 13 which can receive components 5 from said track 3.

The feeding assembly 1 further comprises a pivot 15 on which the pickup platform 11 can be selectively rotated between a first position and second position, wherein in its first position the pocket 13 is aligned with the track 5 and the pocket 13 is parallel with the sloped surface 7 of the track 5, so that a component 5 can move from the track 3 into the pocket 13 of the pickup platform 11, and in its second position the pocket 13 is in a horizontal orientation. Most preferably said pivot 15 on which the pickup platform can be selectively rotated provides an axis of rotation 15' which is parallel to the direction (x) in which the components are moved along the track 3.

Figure 5:
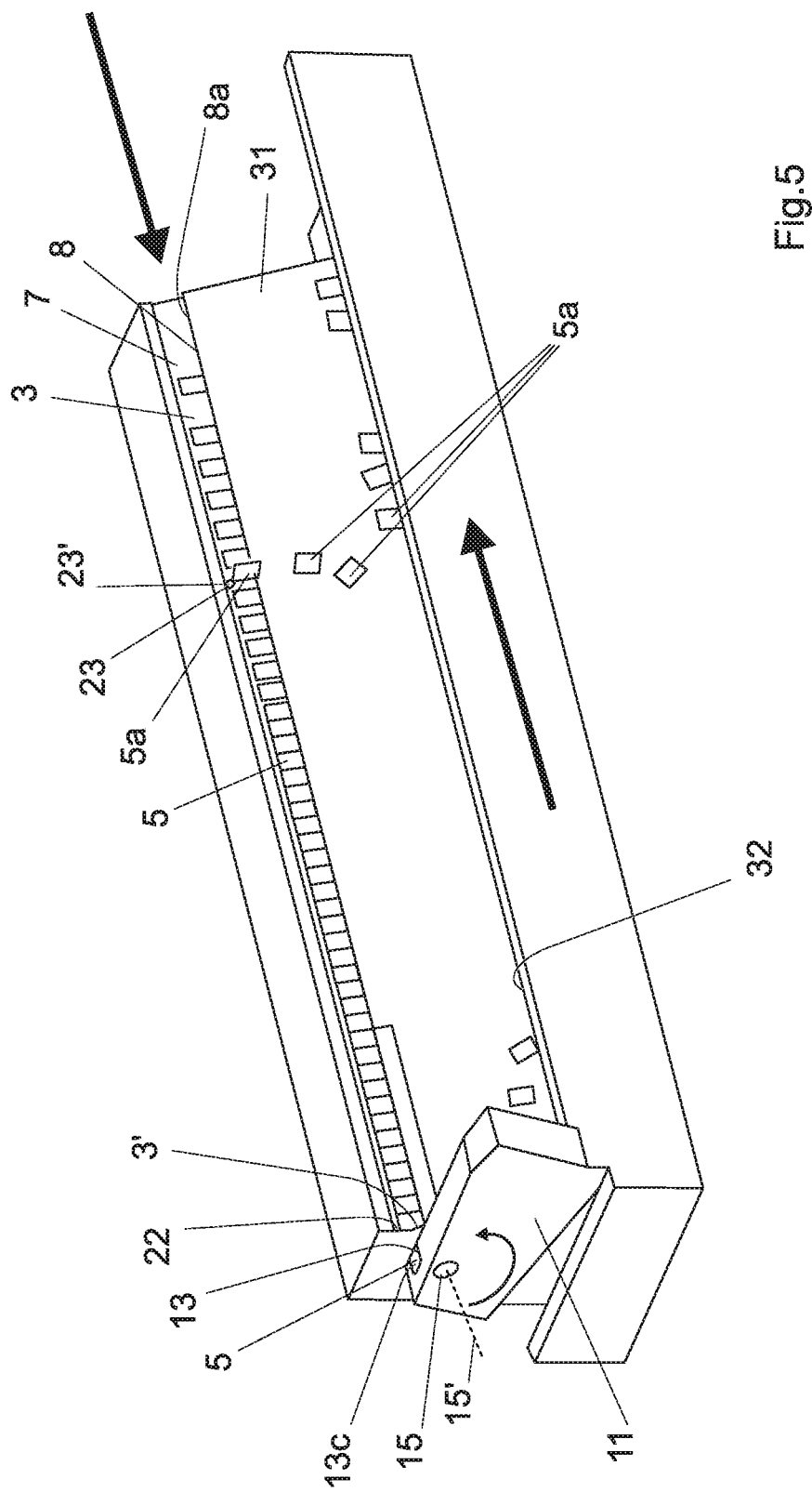
Figure 6:
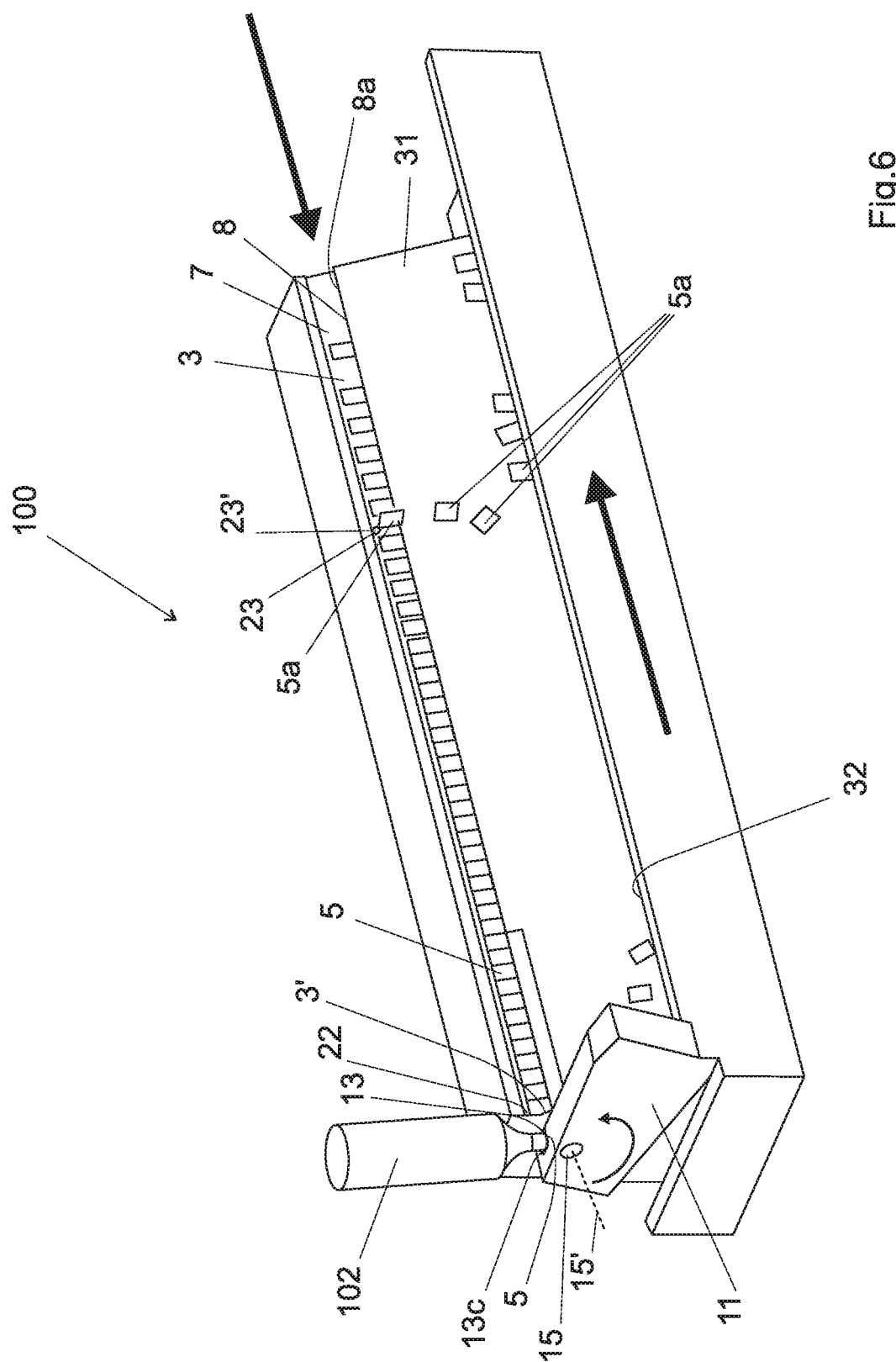
Figure 7:
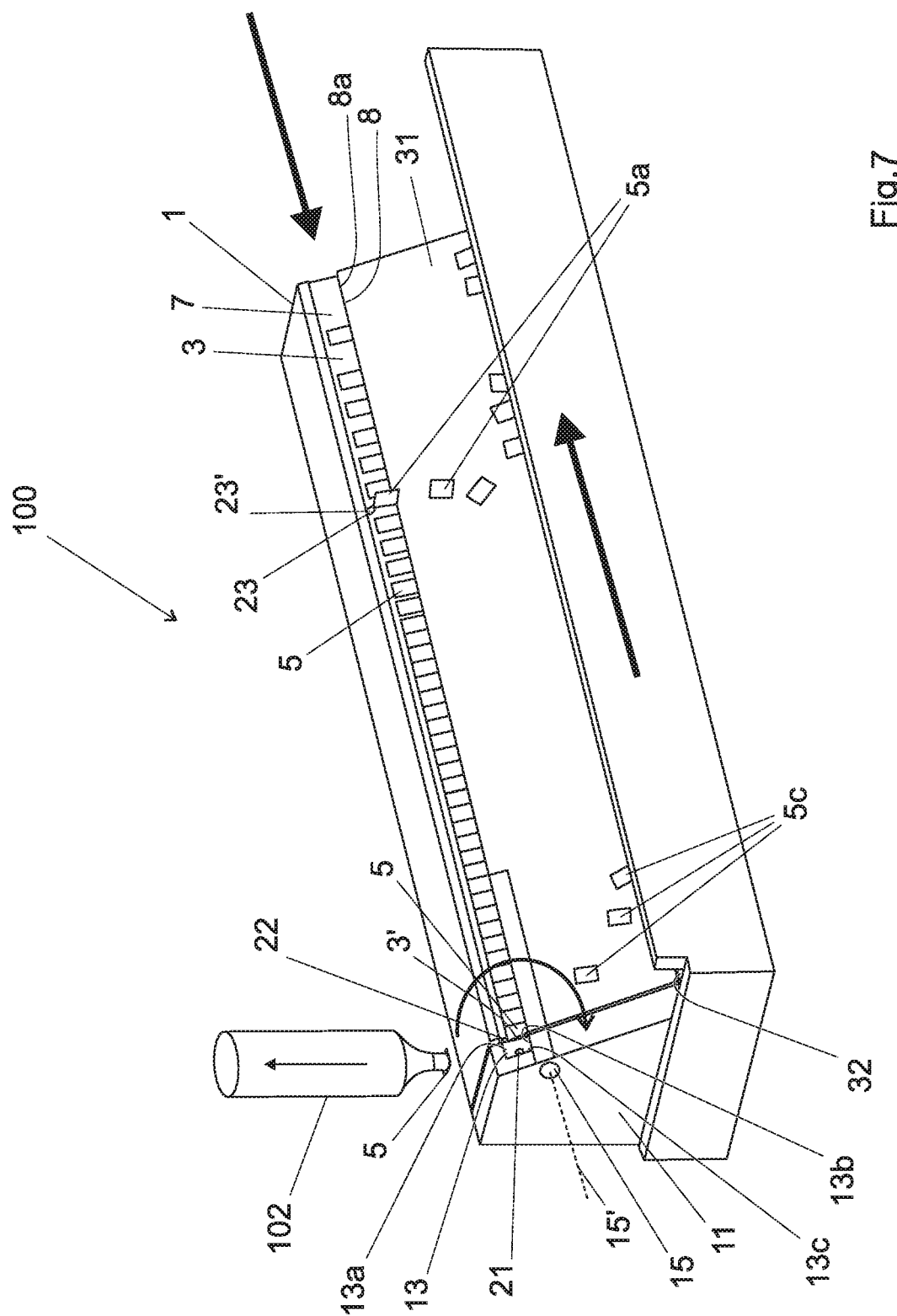

FIGS. 1-4 shown the pickup platform 11 in its first position; FIG. 5 show the pickup platform 11 rotating around the pivot 15 to move from its first position into its second position; FIGS. 6 and 7 shown the pickup platform 11 in its second position wherein the pocket 13 is horizontal.

In this preferred embodiment the thickness of the ledge 8 is equal to, or less than, the thickness of the side of a component 5 so that only one single component 5 can occupy any respective position along the track 3. It should be noted that the thickness of the ledge 8 is the distance from the sloped surface 7 to the edge of the ledge 8. Preferably the thickness of the ledge 8 is between 20-100 µm. More preferably the thickness of the ledge 8 is between 30-70 µm. In this example the thickness of the ledge 8 is 50 µm. In this particular example the thickness of the components 5 which move along the track is 50 um. In this example the components 5 are each cuboid-shaped, having an upper surface, and a lower surface which is opposite to the upper surface, and four side surfaces each with a height of 50 um. So in this particular exemplary embodiment the thickness of the ledge 8 is equal to the thickness of the side of a component 5.

Components on the track 3 will rest, on their side, on the ledge 8, and will lean against the sloped surface 7 so as to achieve a tilted orientation—the components will be moved along the track in this tilted orientation. Because the thickness of the ledge 8 is equal to, or less than, the thickness of said side of the component 5, at any position along the length of the track 5 the ledge 8 is only thick enough to support one single component 8; two or more components cannot occupy the same position along track 3. If two components 5 are moved to overlay each other (i.e. if one component 'piggybacks' on another), or partially overlay each other, on the track 3, then the side of only one of the components (i.e. the side of the component closest to the sloped surface) will be supported on the ledge 8, and the other component (i.e. the component which is overlaying, or partially overlaying, the component closest to the sloped surface) will fall from the ledge 8 since it is not supported by the ledge.

In this embodiment the pocket 13 comprises, a first surface 13a and second surface 13b; wherein the first and second surfaces 13a, 13b are arranged such that when the pickup platform 11 is in its first position the first surface 13a is aligned with the sloped surface 7 of the track, and the second surface 13b is aligned with the surface 8a of the ledge 8; and when the pickup platform 11 is in its second position the first surface 13a is in a horizontal orientation. In this embodiment first surface 13a and second surface 13b are be perpendicular to one another or substantially perpendicular to one another.

The pocket 13 of the pickup platform further comprises a wall 13c which blocks movement of a component 5 in a direction parallel to the direction (x) in which the components move along the track 3.

A first outlet 21 is provided in the pocket 13 of the pickup platform 11. The first outlet 21 is fluidly connected to a vacuum generating means (not shown) which can be selectively operated to generate a vacuum. The first outlet 21 is positioned such that a component 5 which has been passed from the track 3 into the pocket 13 will overlay said first outlet 21. Advantageously, a vacuum provided at said first outlet 21 by the vacuum generating means, will hold the component 5 in the pocket 13 as the pickup platform 11 is rotated between its first and second positions. Most preferably the vacuum generating means is configured to generate a vacuum so as to provide a vacuum at said first outlet 21, only when a component 5 is present in the pocket. Most preferably the vacuum generating means is configured to stop providing a vacuum at said first outlet 21 when the pickup platform is in its second position. This allows a pickup head (such as a pickup head on a turret), which is designed to hold a component using vacuum, to more easily pick the component from the pocket when the pickup platform is in its second position. In another embodiment, the vacuum generating means is configured to stop providing a vacuum at said first outlet 21 only when the component is being picked from the pocket (for example, when the component is being picked from the pocket by a pickup head).

A second outlet 22 is provided at an end 3' of the track 3 which is adjacent to the pickup platform 11. The second outlet 22 is fluidly connected to a vacuum generating means (not shown) which can be selectively operated to generate a vacuum. The said second outlet 22 is positioned such that a component 5 which has reached the said end 3' of the track 3 will overlay said second outlet 22. Advantageously, a vacuum provided at said second outlet 22 by the vacuum generating means, will hold the component 5 on the track 3 as the pickup platform 11 is rotated between its first and second positions. Most preferably the vacuum generating means is configured to generate a vacuum so as to provide a vacuum at said second outlet 22, only when a component occupies the end of the track which is adjacent to the pickup platform.

In this preferred embodiment of the feeder assembly 1, the feeder assembly 1 further comprises a sensor 23 which is arranged to sense when the number of components which are queued-up from the end 3' of the track 5 which is adjacent the pickup platform 11, has reached a predefined maximum. There is further provided a blower 23 which is configured to blow additional components which arrive at said queue off the track 5 when the sensor 23 has detected that the number of components queued-up from the end 3' adjacent the pickup platform has reached a predefined maximum. In this example the blower 23 is integral to the sensor 23; positive air pressure can be provided by the blower 23 through an opening 23' on the track. However it will be understood that in another embodiment the blower and sensor 23 could be provided a two separate components.

The feeder assembly 1 further comprises a slanted surface 31, a feedback track 32, and a delivery device (not shown), wherein said slanted 31 surface is arranged to receive components 5 which have fallen from the track 3 or which have been blown from the track by the blower 23, and to direct said components to said feedback track; and wherein said feedback track 32 is configured to transport said components it receives from the slanted surface 31 to the delivery device. The delivery device is configured to deliver said components which it receives from the feedback track 32 back on to the track 5. Most preferably the delivery device is configured to deliver said components back on to the track by delivering said components onto an end of the track which is opposite to the end 3' of the track which is adjacent the pickup platform 11.

The components may be moved along the track 3 using any suitable means. For example, the feeder assembly 1 could comprise a first vibration means (not shown) which is operably connected to the track 3 and which can be selectively operated to vibrate the track 5, wherein vibration of the track causes the components 5 to move along the track 3 towards the pickup platform 11. Most preferably vibration of the track by the first vibration means would also cause a component, which is at the end 3' of the track adjacent to the pickup platform 11, to move from the track 3 into the pocket 13 of the pickup platform 11.

Likewise the components may be moved along the feedback track 32 using any suitable means. For example, the feeder assembly 1 could comprise second vibration means (not shown) which is operably connected to the feedback track 32, and which can be selectively operated to vibrate the feedback track 32, wherein vibration of the feedback track 32 causes the components 5 which are on the feedback track 32 to move along the feedback track 32 towards the delivery device. Most preferably vibration of the feedback track 32 by the second vibration means causes the components 5 which are on the feedback track 32 to move along the feedback track 32 towards the delivery device and to subsequently move from the feedback track 32 into the delivery device.

In yet another embodiment the feeder assembly 1 could alternatively comprises a single vibration means only; the single vibration means is connected to both the track 5 and the feedback track 32 and is operable to vibrate both these tracks to cause the components to move as described above.

Advantageously, in the feeder assembly 1, the track 3 having a sloped surface 7 and ledge 8 ensures that components 5 are maintained in a tilted orientation as they move along the track 3; because of the tilted orientation a component 5 which overlays, or partially overlays, another component 5 on the track 3 will more easily fall from the track 3, thus ensuring that components 5 will move in single-file along the track 3. However securing picking of component from the feeder assembly 1 could not be achieved if the components are picked in the tilted orientation; moving a component into the pocket 13 of the pickup platform 11 and then rotating the pickup platform 11 to move the pocket 13 into a horizontal orientation brings the component 5 into an orientation which is optimum for secure picking of the component 5 from the pocket 13. Thus, the present invention advantageously provides for more reliable single-file movement of the components 5 along the track 3, without compromising secure picking.

FIGS. 6 and 7 show a component handling assembly 100 according to a further aspect of the present invention which uses the above mentioned feeder assembly 1. The component handling assembly 100 comprises the feeder assembly 1, and a pickup head 102, wherein said pick up head 102 is arranged such that it can be aligned over the pocket 13 of the pickup platform 11 when the pickup platform 11 is in its second position. Specifically, in this example embodiment in which the pocket 13 of the pickup platform 11 comprises, a first surface 13a and second surface 13b, wherein the first and second surfaces 13a, 13b are arranged such that when the pickup platform 11 is in its first position the first surface 13a is aligned with the sloped surface 7 of the track 3, and the second surface 13b is aligned with the surface 8a of the ledge 8 of the track 5, and when the pickup platform is in its second position the first surface 13a is in a horizontal orientation, the pickup head 102 is configured so that so that it can be selectively arranged to overlay the first surface 13a of the pocket 13 when the pickup platform 11 is in its second position.

The pickup head 102 could be provided on a rotatable turret (not shown) which comprises a plurality of pickup heads, and wherein the turret is arranged so that it can be rotated so that each pickup head on the turret is consecutively aligned over the pocket 13 of the pickup platform 11 when the pickup platform is in its second position.

The above mentioned feeder assembly 1 could be used to perform a method of feeding components 5, comprising the essential steps of, moving components 5 along the track 3 of the feeder assembly 1; moving a component 5 from the track 3 into the pocket 13 of the pickup platform 11; after the component 5 has been moved into the pocket 13 of the pickup platform 11, rotating the pickup platform 11 around the pivot 15 to its second position.

An exemplary, method of feeding components, according to an embodiment of the present invention will now be described with reference to FIGS. 1-5.

As shown in FIG. 1 components 5 along the track 3 of the feeder assembly 1 in a direction (arrow 'x') towards the pickup platform 11. The pickup platform 11 is in its first position, wherein the pocket 13 is aligned with the track 5 and the pocket 13 is parallel with the sloped surface 7 of the track 5; more specifically, the first surface 13a of the pocket 13 is aligned with the sloped surface 7 of the track 3, and the second surface 13b of the pocket 13 is aligned with the surface 8a of the ledge 8 of the track 3.

In this example the components are moved along the track 3 using a first vibration means (not shown) which is operably connected to the track 3: the first vibration means vibrates the track 3 to cause the components 5 to hop along the track 5 towards the pickup platform 11.

Figure 2:
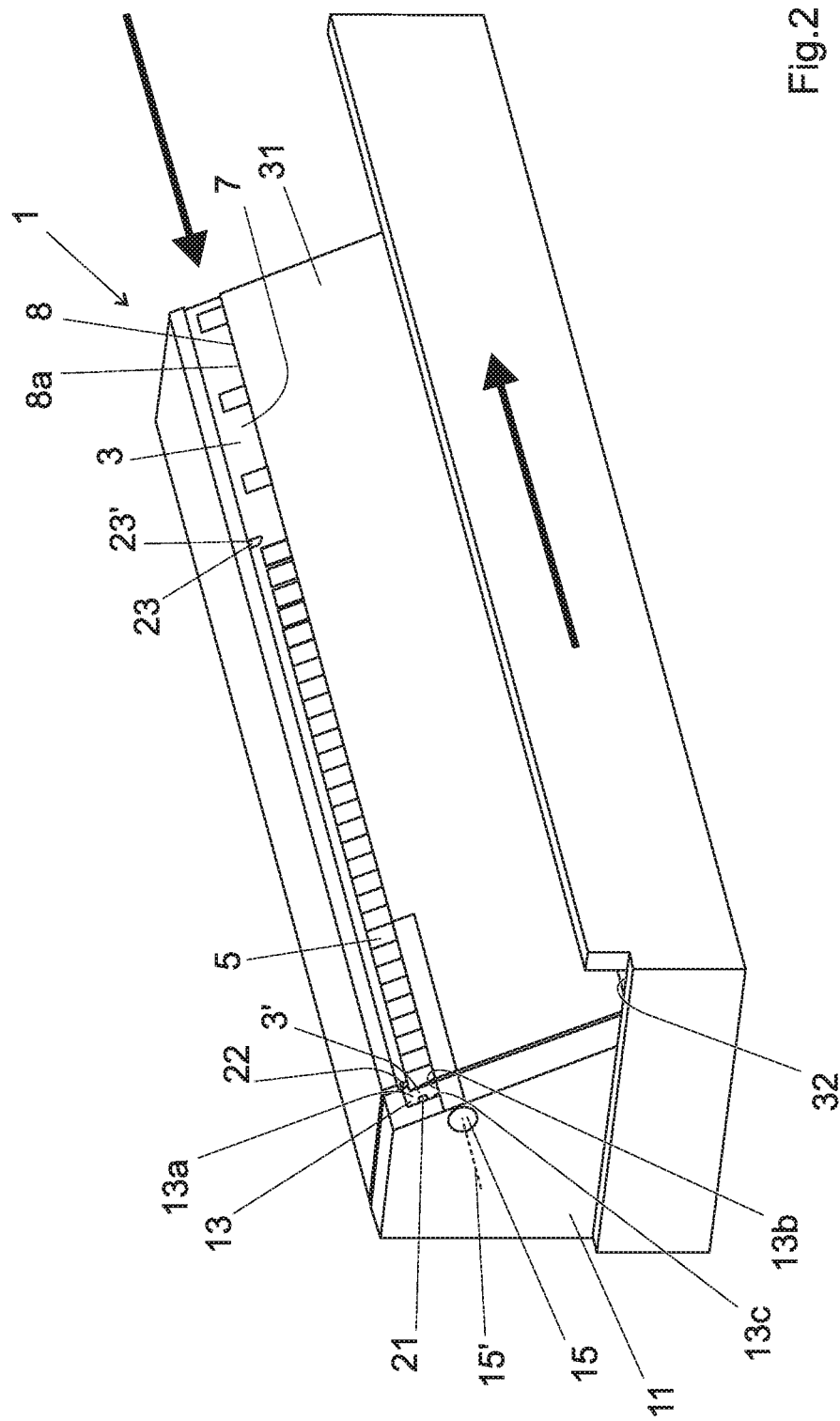

As shown in FIG. 2, when a component reaches the end 3' of the track which is adjacent the pickup platform 11, the vibration of the track 5 by the first vibration means causes the component 5, which is at the end 3' of the track 5 adjacent to the pickup platform 11, to move from the track 3 into the pocket 13 of the pickup platform 11. A vacuum is then provided at the first outlet 21 (by a vacuum generating means which is fluidly connected to the first outlet 21). The vacuum provided at said first outlet 21 by the vacuum generating means, will hold the component 5 in the pocket 13 as the pickup platform 11 is rotated between its first and second positions.

A vacuum is then provided at the second outlet 22 (by a vacuum generating means which is fluidly connected to the second outlet 22). This vacuum holds the next component 5 (i.e. the component which is adjacent the component which has been moved into the pocket 13) on the track 3. The vacuum provided at said second outlet 22 will hold said next component 5 on the track 3 as the pickup platform 11 is rotated between its first and second positions.

Since the next component is held in position on the track by the vacuum provided at the second outlet 22, the components queue-up from the end 3' of the track 5 which is adjacent the pickup platform 11. When the queue of components 5 grows to the extent where the components are backed up to as far as the sensor 23 along the track 5, then the sensor 23 senses that the number of components which are queued-up from the end 3' of the track 5 has reached a predefined maximum. In response to sensing that the number of components which are queued-up from the end 3' of the track 5 has reached the predefined maximum, the sensor initiates the blower 23 to provide a positive air pressure through the opening 23'.

Figure 3:
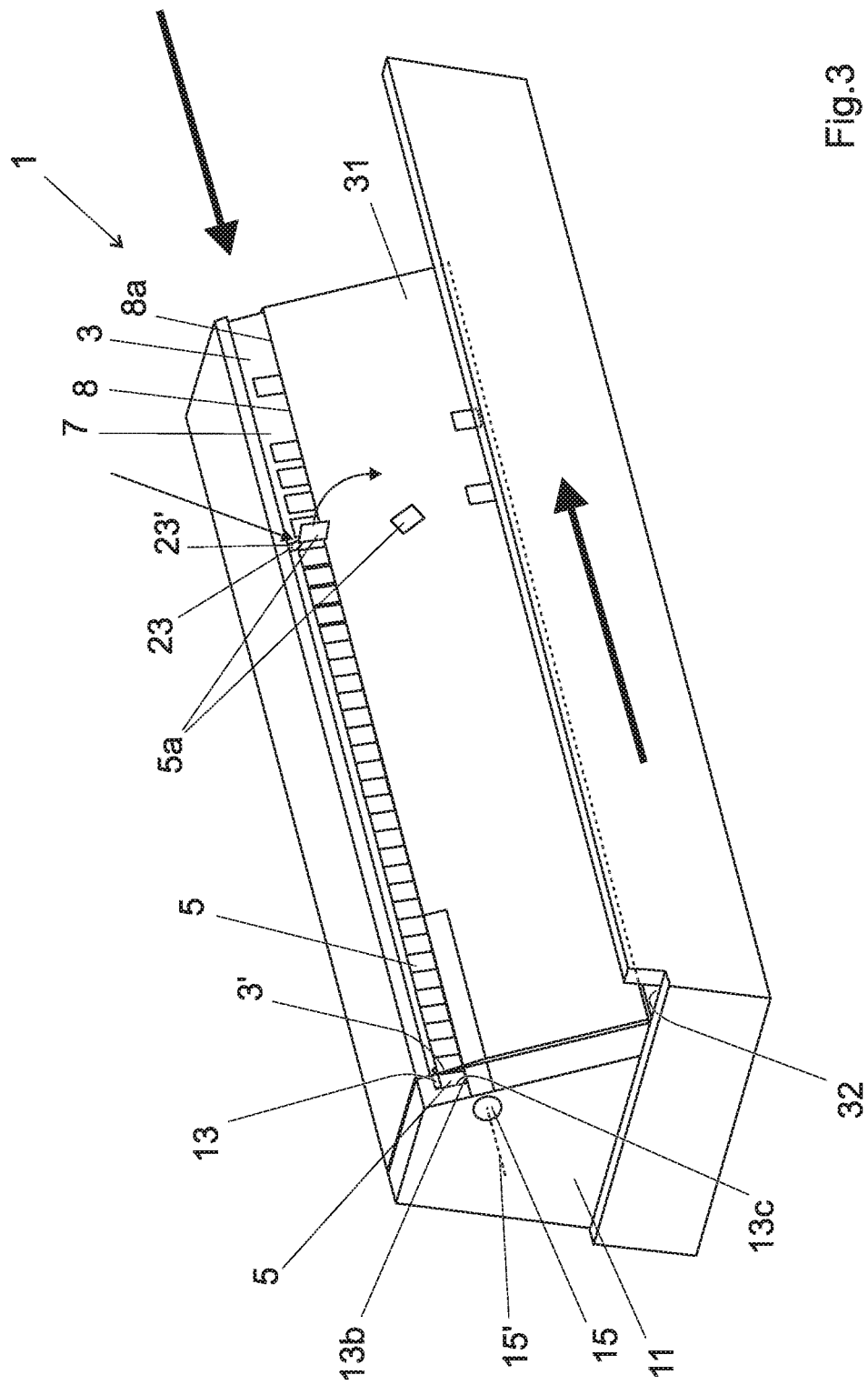

As shown in FIG. 3 the positive air pressure provided by the blower 23 blows any additional component(s) 5a which arrive at said queue off the track 5. The component(s) 5a which are blown from the track 5 are moved onto the slanted surface 31; these component(s) 5a slide along the slated surface 31, under the influence of gravity, and onto the feeder track 32. The feedback track 32 transports said component(s) 5a it receives from the slanted surface 31 to the delivery device; and the delivery device delivers said component(s) 5a which it receives from the feedback track 32 back onto the track 5. Most preferably the delivery device is configured to deliver said component(s) 5a which it receives from the feedback track 32 back onto the track 5 by delivering said component(s) 5a onto an end of the track which is opposite to the end 3' of the track which is adjacent the pickup platform 11.

Figure 4:
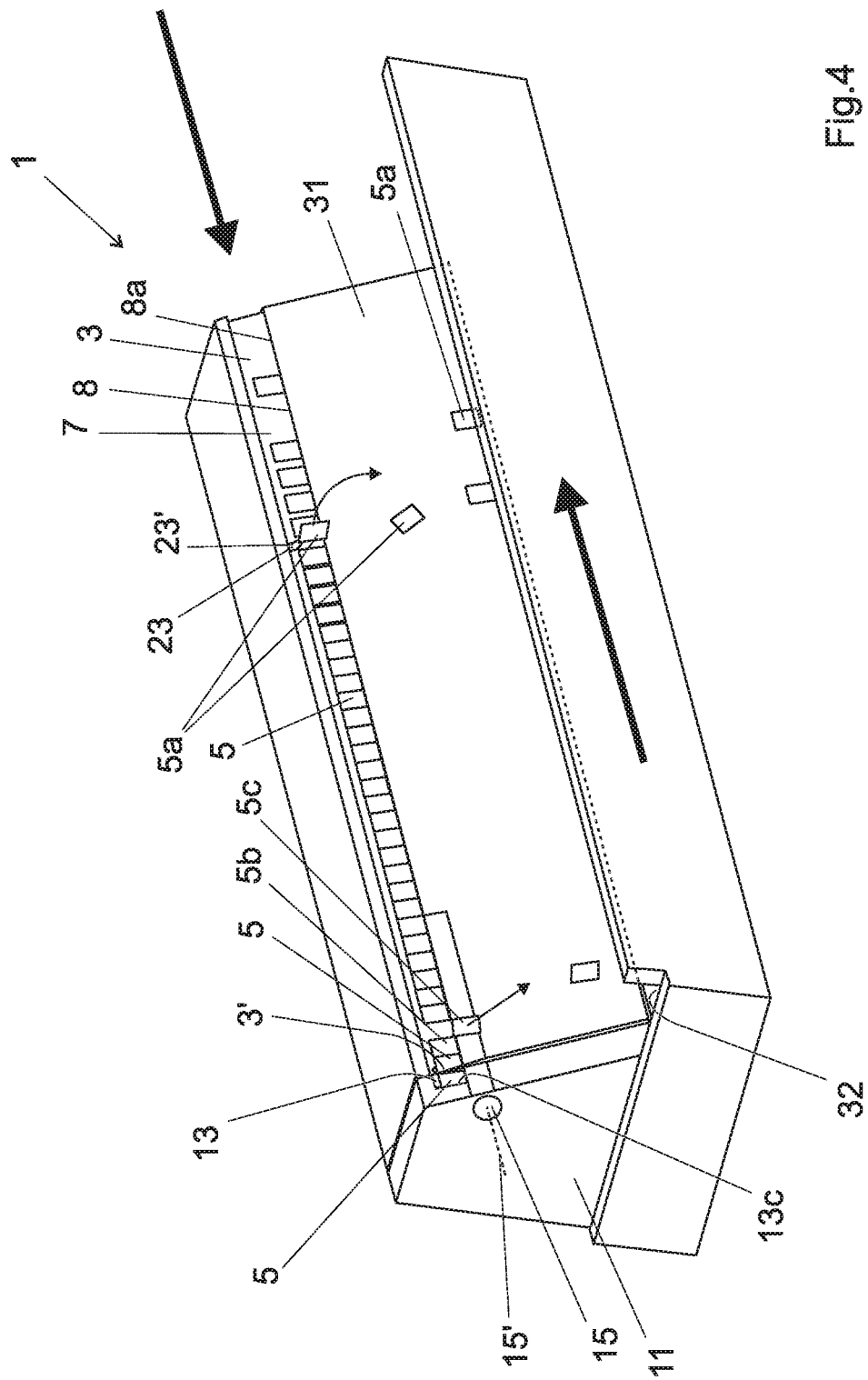

FIG. 4 illustrates what happens when a second component 5c, overlays, or partially overlays, a first component 5b on the track 3. Because the thickness of the ledge 8 is equal to, or less than, the thickness of the side of a component 5, the ledge is only thick enough to support one component only at any position along the track. Thus, when the second component 5c moves to overlay, or partially overlay, the first component 5b, the second component 5c is no longer supported by the ledge 8 and the second component 5c will fall from the ledge 8.

The second component 5c which falls from the track 5 falls onto the slanted surface 31; the second component 5c slides along the slated surface 31, under the influence of gravity, and onto the feeder track 32. The feedback track 32 transports said second component 5c from the slanted surface 31 to the delivery device; and the delivery device delivers said second component 5c from the feedback track 32 back onto the track 5. Most preferably the delivery device is configured to deliver said second component 5c back onto the track 5 by delivering said second component 5c onto an end of the track which is opposite to the end 3' of the track which is adjacent the pickup platform 11.

As shown in FIG. 5, with the component 5 held in the pocket 13 of the pickup platform 11, by means of the vacuum provided at the first outlet 21, the pickup platform 11 is then rotated from its first position to its second position; in other words the vacuum provided at said first outlet 22 will prevent the component 5 which is in the pocket from becoming displayed from the pocket as the picking platform rotates about the pivot 15. The vacuum provided at said second outlet 22 by the will hold the component 5, which is at the end 3' of the track 5, on the track 3, as the pickup platform 11 is rotated from its first position to its second position; in other words the vacuum provided at said second outlet 22 will prevent the component 5 which is at the end 3' of the track from becoming displayed from the track 5 by the picking platform as it rotates about the pivot 15.

As shown in FIG. 6, once the picking platform 11 has been rotated to its second position, the pocket 13 will be in a horizontal orientation. Specifically, when the picking platform 11 is in its second position, the first surface 13a of the pocket 13 is in a horizontal orientation.

Once the picking platform 11 has been rotated to its second position, the vacuum generating means which provided vacuum to the first outlet 21 is turned off, so that the component 5 in the pocket 13 is no longer held by vacuum in the pocket 13. This allows the component 5 to be more easily picked from the pocket 13.

When the picking platform 11 has been rotated to its second position, a pickup head 102 will then be aligned over the pocket 13. The pickup head will advance towards the component in the pocket 13, and a vacuum will be applied by the pickup head 102 to the component 5 so that the component 5 is held on the pickup head 102 by vacuum. When the pickup head 102 holding the component 5 by vacuum, the pickup head is moved away from the pocket 13.

In another embodiment the vacuum generating means which provides vacuum to the first outlet 21 is turned off, only when the pickup head applies its vacuum to the component in the pocket 13, or just before the pickup head applies its vacuum to the component in the pocket 13.

As shown in FIG. 7, once the pickup head 102 has picked the component from the pocket 13, the picking platform 11 is then rotated back around the pivot 15, from its second position to its first position.

The vacuum provided at the second outlet 22 (by a vacuum generating means which is fluidly connected to the second outlet 22) is then turned off so that the next component 5, which is waiting at the end 3' of the track is no longer held by vacuum at the end of the track. This next component is then moved, by the vibration of the track 5, from the track 5 into the pocket 13, and the above-mentioned steps are repeated for this component so that is it picked by the pickup head 102.

The above-mentioned steps may be repeated for any number of components.

In a preferred embodiment the pickup head 102 will be a pickup head provided on a rotatable turret, said rotatable turret comprising a plurality of pickup heads. In such a case the method will further comprise the steps of picking the component from the pocket using a pickup head on the turret; moving the next component 5, which is waiting at the end 3' of the track into the pocket 13; rotating the picking platform 11 to its second position; and rotating the turret so that the next pickup head is aligned over the pocket 13 of the pickup platform; and picking said next component from the pocket using said next pickup head.

The above-mentioned steps may be repeated for any number of components.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A feeding assembly comprising:
   a track along which components can be moved, said track comprising a sloped surface and a ledge,
   wherein said sloped surface slopes in a direction which is perpendicular to the direction which the components move along the track so that the components are maintained in a tilted orientation as they move along the track;
   a pickup platform comprising a pocket which can receive components from said track, the pocket comprising a first surface and a second surface; and
   a pivot on which the pickup platform can be selectively rotated between a first position and a second position,
   wherein, in the first position, the pocket is aligned with the track and the pocket is parallel with the sloped surface of the track so that a component can move from the track into the pocket of the pickup platform, and in the second position, the pocket is in a horizontal orientation, wherein, when the pickup platform is in the first position, the first surface is aligned with the sloped surface of the track, an uppermost surface of the pickup platform is in a horizontal orientation, and the second surface is aligned with a surface of the ledge that is perpendicular to the sloped surface, and wherein, when the pickup platform is in the second position, the first surface is in a horizontal orientation.

2. The feeding assembly according to claim 1, wherein the thickness of the ledge is equal to, or less than, the thickness of the side of the component so that only one single component can occupy any respective position along the track.

3. The feeding assembly according to claim 2, wherein the thickness of the ledge is between 20 and 100 µm.

4. The feeding assembly according to claim 1, wherein a first outlet is provided in the pocket of the pickup platform, and wherein said first outlet is positioned such that a component which has been passed from the track into the pocket will overlay said first outlet and be secured to the first outlet by applying vacuum pressure.

5. The feeding assembly according to claim 1, wherein a second outlet is further provided at an end of the track which is adjacent to the pickup platform, and wherein said second outlet is positioned such that a component which has reached the said end of the track will overlay said second outlet and be secured to the second outlet by applying vacuum pressure.

6. The feeding assembly according to claim 1, further comprising a sensor which senses when a number of components queued-up from an end adjacent the pickup platform has reached a predefined maximum.

7. The feeding assembly according to claim 6, further comprising a blower configured to blow additional components which arrive at said queue off the track when the sensor has detected that the number of components queued-up from the end adjacent the pickup platform has reached a predefined maximum.

8. The feeding assembly according to claim 1, further comprising a slanted surface and a feedback track,
wherein said slanted surface is directly connected to and extends between the track and the feedback track, and is arranged to
receive components which have fallen from the track or have been blown from the track by a blower, and direct said components to said feedback track,
wherein said feedback track is configured to transport said components it receives from the slanted surface to an end of the feedback track opposite the pickup platform, and
wherein the feeding assembly is configured to return said components back on to the track.

9. The feeding assembly according to claim 8, wherein the feedback track is configured to vibrate such that vibration of the feedback track causes the components which are on the feedback track to move along the feedback track towards an end of the feedback track opposite the pickup platform.

10. The feeding assembly according to claim 1, wherein the track is configured to vibrate such that vibration of the track causes the components to move along the track towards the pickup platform.

11. A component handling assembly comprising:
a feeder assembly comprising
a track along which components can be moved, said track comprising a sloped surface and a ledge,
wherein said sloped surface slopes in a direction which is perpendicular to the direction which the components move along the track so that the components are maintained in a tilted orientation as they move along the track,
a pickup platform comprising a pocket which can receive components from said track, the pocket comprising
a first surface and a second surface,
a pivot on which the pickup platform can be selectively rotated between a first position and a second position,
wherein, in the first position, the pocket is aligned with the track and the pocket is parallel with the sloped surface of the track so that a component can move from the track into the pocket of the pickup platform, and in the second position, the pocket is in a horizontal orientation,
wherein, when the pickup platform is in the first position, the first surface is aligned with the sloped surface of the track, an uppermost surface of the pickup platform is in a horizontal orientation, and the second surface is aligned with a surface of the ledge that is perpendicular to the sloped surface,
wherein, when the pickup platform is in the second position, the first surface is in a horizontal orientation; and
a pickup head, wherein said pickup head is arranged such that it can be aligned over the pocket of the pickup platform when the pickup platform is in the second position.

12. A component handling assembly according to claim 11, wherein the pickup head is configured to rotate so that the pickup head can be consecutively aligned over the pocket of the pickup platform when the pickup platform is in the second position.

13. A method of feeding components using a feeder assembly including a track having a sloped surface and a ledge, a pickup platform with a pocket, the pocket having a first surface and a second surface, and a pivot on which the pickup platform can be selectively rotated between a first position and a second position, comprising the steps of:
moving, when the pickup platform is in the first position, components along the track of the feeder assembly;
moving, when the pickup platform is in the first position, a component from the track into the pocket of the pickup platform;
after the component has been moved into the pocket of the pickup platform, rotating the pickup platform around the pivot to the second position,
wherein, when the pickup platform is in the first position, the first surface is aligned with the sloped surface of the track, an uppermost surface of the pickup platform is in a horizontal orientation, and the second surface is aligned with a surface of the ledge that is perpendicular to the sloped surface, and
wherein, when the pickup platform is in the second position, the first surface is in a horizontal orientation.

14. The method according to claim 13, further comprising the steps of
picking said component from the pocket of the pickup platform while the pickup platform is in the second position.

15. The method according to claim 13, further comprising the steps of
rotating the pickup platform around the pivot to the first position;
moving a second component from the track into the pocket of the pickup platform;

after the component has been moved into the pocket of the pickup platform, rotating the pickup platform around the pivot to the second position.

16. The method according to claim 13, further comprising the step of applying a vacuum to a component which is located in the pocket, wherein the vacuum holds the component in the pocket as the pickup platform is rotated between the first position and the second position.

17. The method according to claim 13, further comprising the step of applying a vacuum to a component which is located at an end of the track adjacent to the pickup platform, wherein the vacuum holds the component on the track as the pickup platform is rotated between the first position and the second position.

18. The method according to claim 13, further comprising the steps of detecting when the number of components queued-up along the track, from an end of the track adjacent the pickup platform, has reached a predefined maximum; and in response to detecting that the number of components queued-up along the track, from said end of the track, has reached a predefined maximum, blowing components which arrive at said queue off the track.

19. The method according to claim 13, further comprising the steps of receiving on a slanted surface components which have fallen from the track or have been blown from the track by a blower, and sliding, under the influence of gravity, said received components along said slanted surface and onto a feedback track, wherein the slanted surface is directly connected to and extends between the track and the feedback track;

moving said components along said feedback track to an end of the feedback track opposite the pickup platform; and returning said components onto the track.

20. The method according to claim 13, further comprising the steps of picking, when the pickup platform is in the second position, said component from the pocket of the pickup platform using a pickup head;

rotating the pickup platform around the pivot to the first position;

moving another component from the track into the pocket of the pickup platform;

after said other component has been moved into the pocket of the pickup platform, rotating the pickup platform around the pivot to the second position;

rotating the pickup head to be aligned over the pocket of the pickup platform; and picking said other component from the pocket using said pickup head.

* * * * *